(12) United States Patent
Budd et al.

(10) Patent No.: US 9,636,783 B2
(45) Date of Patent: May 2, 2017

(54) METHOD AND APPARATUS FOR LASER DICING OF WAFERS

(71) Applicant: International Business Machines Corporation, Armonk, NY (US)

(72) Inventors: Russell A. Budd, North Salem, NY (US); Bing Dang, Chappaqua, NY (US); John U. Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 14/265,672

(22) Filed: Apr. 30, 2014

(65) Prior Publication Data
US 2015/0318210 A1 Nov. 5, 2015

(51) Int. Cl.
| | |
|---|---|
| *H01L 21/00* | (2006.01) |
| *B23K 26/364* | (2014.01) |
| *H01L 21/67* | (2006.01) |
| *B23K 26/36* | (2014.01) |
| *H01L 21/78* | (2006.01) |
| *H01L 21/304* | (2006.01) |
| *H01L 21/306* | (2006.01) |
| *B23K 26/06* | (2014.01) |
| *B23K 26/18* | (2006.01) |
| *B23K 26/38* | (2014.01) |
| *B23K 26/402* | (2014.01) |
| *B23K 26/0622* | (2014.01) |
| *B23K 101/40* | (2006.01) |
| *B23K 103/00* | (2006.01) |

(52) U.S. Cl.
CPC ........ *B23K 26/364* (2015.10); *B23K 26/0624* (2015.10); *B23K 26/0626* (2013.01); *B23K 26/18* (2013.01); *B23K 26/367* (2013.01); *B23K 26/38* (2013.01); *B23K 26/402* (2013.01); *H01L 21/304* (2013.01); *H01L 21/306* (2013.01); *H01L 21/67115* (2013.01); *H01L 21/78* (2013.01); *B23K 2201/40* (2013.01); *B23K 2203/56* (2015.10)

(58) Field of Classification Search
CPC .................................................. H01L 21/67092
USPC ........................................................ 438/460
See application file for complete search history.

(56) References Cited

U.S. PATENT DOCUMENTS

| | | | | |
|---|---|---|---|---|
| 5,022,960 | A * | 6/1991 | Takeyama | H01L 21/4803 216/13 |
| 5,258,236 | A * | 11/1993 | Arjavalingam | H01L 21/6835 428/620 |
| 6,562,698 | B2 * | 5/2003 | Manor | B23K 26/0604 257/E21.599 |

(Continued)

OTHER PUBLICATIONS

Borkulo et al., "Multi Beam Grooving and Full Cut Laser Dicing of IC Wafers", A.L.S.I. (Advanced Laser Separation International), 2011, 6 pages.

*Primary Examiner* — Igwe U Anya
(74) *Attorney, Agent, or Firm* — Harrington & Smith

(57) ABSTRACT

A method includes cutting a semiconductor wafer on a substrate wafer using at least one laser. By setting the laser to a set of parameters that define a laser beam, the laser beam can avoid ablation of the substrate wafer. The laser beam is also set equal to, or within, an ablation threshold of the semiconductor wafer for selectively ablating the semiconductor wafer. The set of parameters includes wavelength, pulse width and pulse frequency.

23 Claims, 5 Drawing Sheets

(56) References Cited

U.S. PATENT DOCUMENTS

| | | | |
|---|---|---|---|
| 6,653,210 B2 | 11/2003 | Choo et al. | |
| 6,992,026 B2 | 1/2006 | Fukuyo et al. | |
| 7,544,588 B2 | 6/2009 | Genda | |
| 7,550,367 B2 | 6/2009 | Tamura et al. | |
| 7,592,238 B2 | 9/2009 | Fukuyo et al. | |
| 7,642,174 B2 | 1/2010 | Kobayashi | |
| 7,838,796 B2 | 11/2010 | Furui | |
| 8,557,715 B2* | 10/2013 | Chung | B41M 5/262 438/765 |
| 2002/0060210 A1* | 5/2002 | Terada | B23K 26/067 219/121.76 |
| 2006/0011593 A1 | 1/2006 | Fukuyo et al. | |
| 2006/0076105 A1* | 4/2006 | Furui | B23K 26/4075 156/257 |
| 2006/0160331 A1 | 7/2006 | Fukuyo et al. | |
| 2007/0287266 A1* | 12/2007 | Chung | B23K 26/10 438/460 |
| 2010/0248451 A1* | 9/2010 | Pirogovsky | B23K 26/0635 438/463 |
| 2010/0264423 A1 | 10/2010 | Wood et al. | |
| 2012/0171804 A1* | 7/2012 | Moslehi | B23K 26/073 438/71 |
| 2012/0234807 A1* | 9/2012 | Sercel | B23K 26/041 219/121.69 |
| 2014/0326295 A1* | 11/2014 | Moslehi | H01L 31/02245 136/249 |
| 2014/0370650 A1* | 12/2014 | Moslehi | H01L 31/18 438/98 |
| 2015/0056744 A1* | 2/2015 | Song | H01L 31/18 438/72 |

* cited by examiner

METHOD AND APPARATUS FOR LASER DICING OF WAFERS

BACKGROUND

Technical Field

The exemplary and non-limiting embodiments relate generally to cutting wafers, and more specifically, to selective partial dicing of either a semiconductor wafer or a glass wafer using a laser emitting a laser beam.

Brief Description of Prior Developments

During the processing of semiconductor wafers it can be advantageous to support the semiconductor wafer on a substrate wafer. In the case where the semiconductor wafer is a silicon wafer a glass substrate wafer may be used. Generally the silicon wafer is bonded to the glass wafer using either an adhesive or double-sided tape.

It is usually desirable to dice the silicon wafer into individual dies. This is conventionally accomplished by using a mechanical saw blade covered with an abrasive such as diamond dust. Dicing of a silicon wafer laminated on a glass support wafer using a saw blade can damage the support wafer due to a lack of accuracy in controlling the depth of the cut. Another issue is caused by variations in the thickness of the silicon wafer and the glass wafer at their interface. The damage to the glass wafer can prevent it from being reused. In some circumstances it may be desirable to only dice the glass wafer without damaging the silicon wafer. Using a saw blade in this situation has the same issues as discussed above.

SUMMARY

In one exemplary aspect, a method for cutting a semiconductor wafer on a substrate wafer includes setting a laser to a set of parameters defining a laser beam. The laser beam thus avoids ablation of the substrate wafer and the laser beam is also set equal to, or within, an ablation threshold of the semiconductor wafer for selectively ablating the semiconductor wafer. The set of parameters includes wavelength, pulse width and pulse frequency.

Another exemplary method of dicing wafers includes selectively dicing a silicon wafer bonded to a substantially transparent substrate by using at least one laser. By setting the laser to emit a laser beam with at least one wavelength in a range of about 200 nm to 500 nm and also setting the laser such that the laser beam has at least one pulse width within a range of pulse widths between about 50 femtoseconds and 10 nanoseconds and further setting the laser such that the laser beam has at least one pulse frequency within a range of pulse frequency from about 100 to 100,000,000 pulses per second, with these settings the laser beam is equal to or below an ablation threshold of the substantially transparent substrate and the laser beam is equal to or above an ablation threshold of the silicon wafer allowing for dicing the silicon wafer while the substantially transparent substrate supports the silicon wafer.

An exemplary apparatus for dicing a semiconductor wafer on a glass wafer where the apparatus comprises a laser adapted to emit a laser beam. The laser beam has parameters selected to avoid ablation of the glass wafer. The laser beam also has parameters selected to cause ablation for dicing the semiconductor wafer such that the glass wafer is re-useable after dicing of the semiconductor wafer is completed. The laser beam's parameters include wavelength, pulse width and pulse frequency.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

Figure 1:
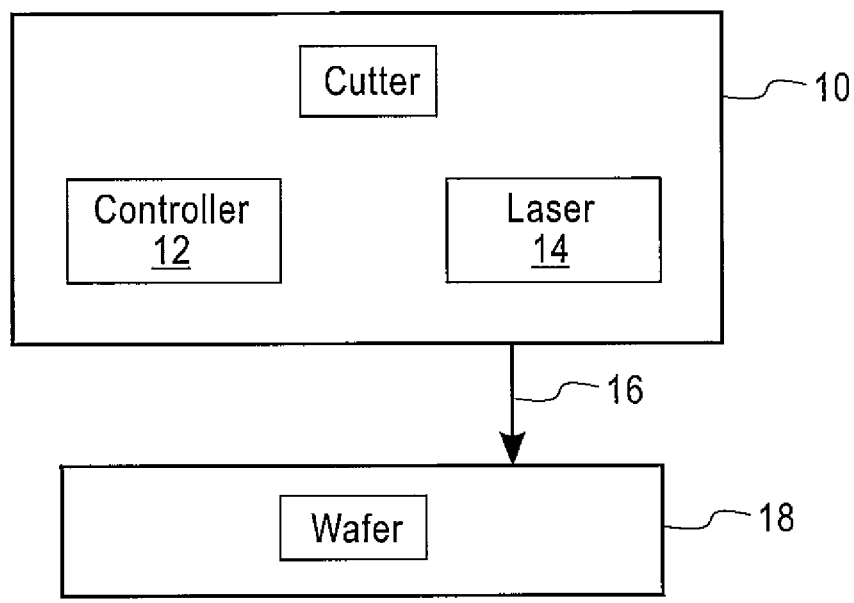
FIG. 1 is a schematic showing wafers to be cut by a cutter that includes a controller and a laser.

Referring first to FIG. 1, a cutter 10 is shown in schematic form. The cutter 10 includes a controller 12 for controlling at least one laser 14. In accordance with input from the controller 12 the laser 14 is set to emit a laser beam 16 capable of cutting wafers 18 as described in more detail below.

Figure 2:
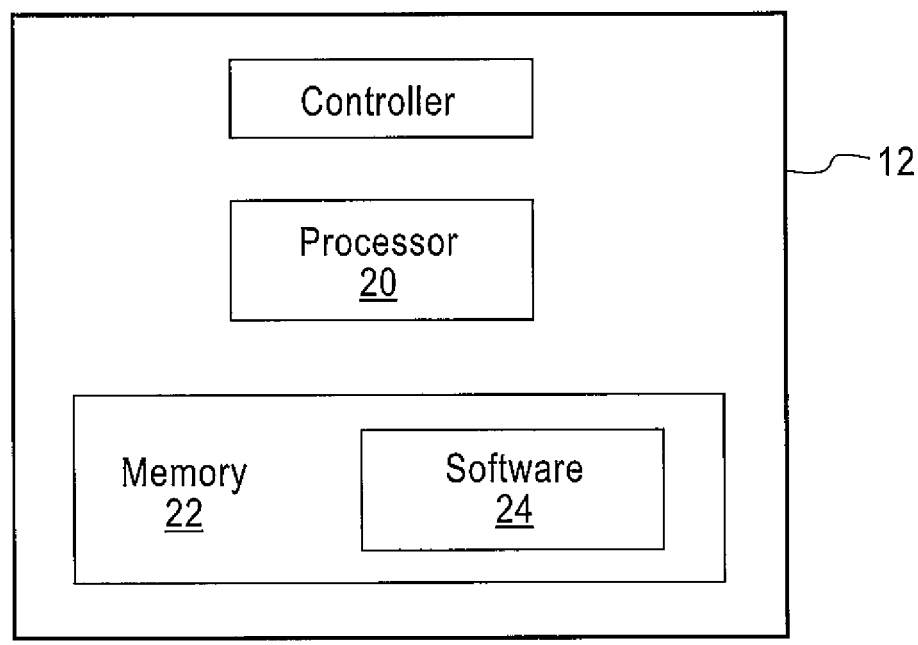
FIG. 2 is a schematic illustration of one exemplary embodiment of the controller shown in FIG. 1.
Figure 3:
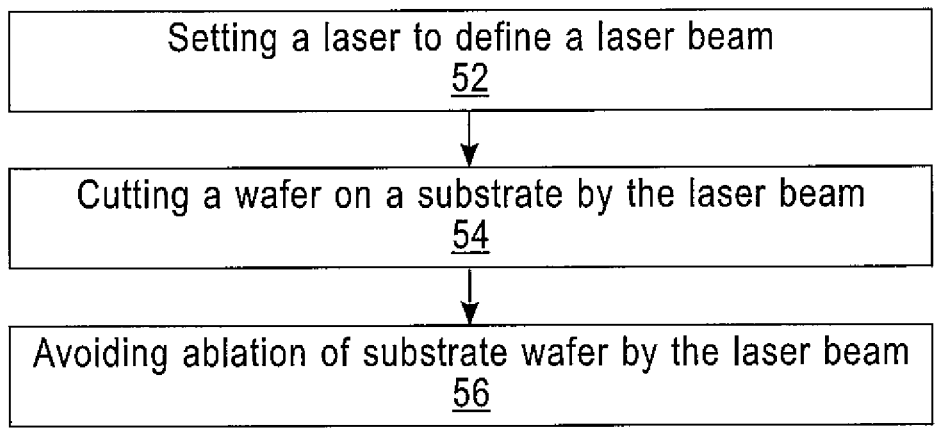
FIG. 3 is a flow chart illustrating one exemplary embodiment of a method of general operation of FIG. 1.

Referring also to FIG. 2, a schematic illustration of the controller 12 is shown. The controller 12 includes a processor 20, a non-transitory memory 22 with software 24 stored thereon. FIG. 3 sets forth a basic exemplary method, as indicated by block 52, of setting a laser to define a laser beam, and in block 54, cutting a wafer on a substrate by the laser beam, and in block 56, avoiding ablation of substrate wafer by the laser beam.

Figure 4:
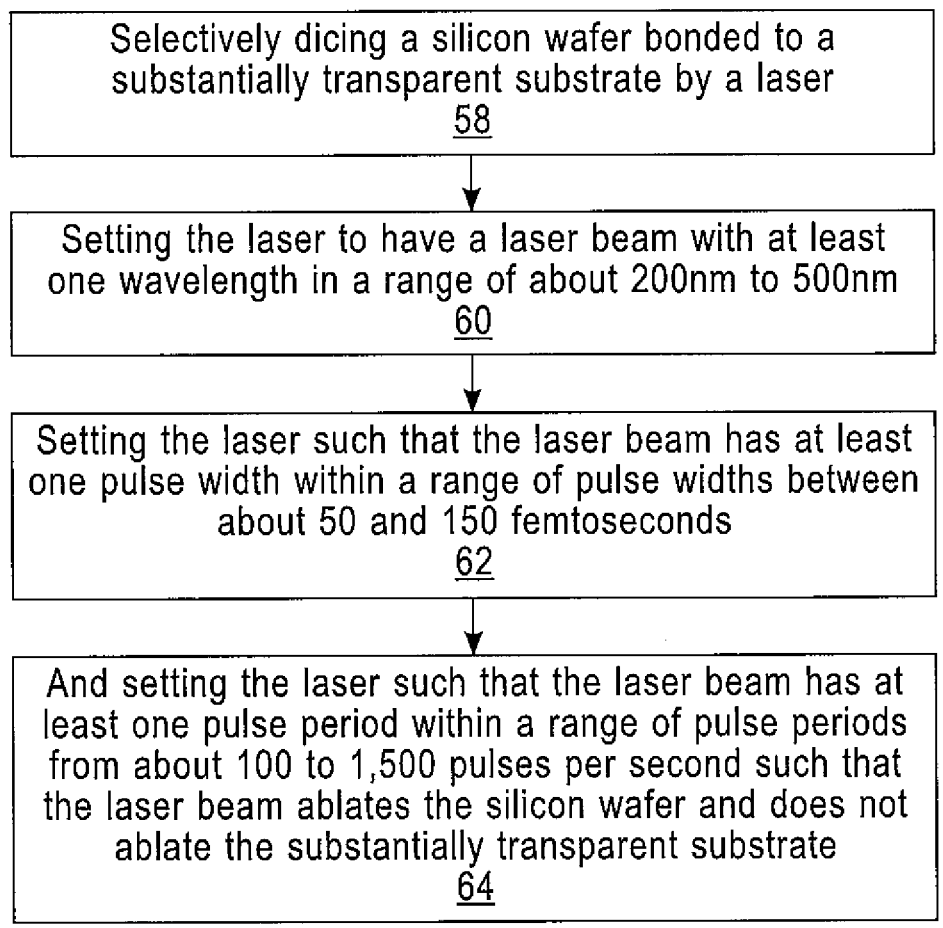
FIG. 4 is a flow chart illustrating another exemplary embodiment of a method of general operation of FIG. 1.

FIG. 4, a flow chart illustrating an exemplary embodiment of a method, as indicated by block 58 of selectively dicing a silicon wafer bonded to a substantially transparent substrate by a laser, and block 60, setting the laser to have a laser beam with at least one wavelength in a range of about 200 nm to 500 nm, and block 62, setting the laser such that the laser beam has at least one pulse width within a range of pulse widths between about 50 femtoseconds and 10 nanoseconds, and block 64, setting the laser such that the laser beam has at least one pulse frequency within a range of pulse frequency from about 100 to 5,000 pulses per second such that the laser beam ablates the silicon wafer and does not ablate the substantially transparent substrate.

Figure 5:
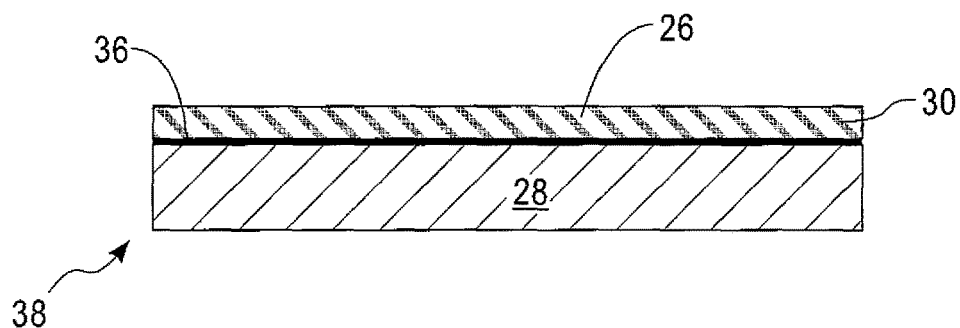
FIG. 5 is a schematic cross-sectional view of two wafers with cross-hatching removed to simplify the view.

With reference now also to FIG. 5, a simplified partial cross-sectional view of a semiconductor wafer 30 on the substrate wafer 28 is shown. The semiconductor wafer 30 may be a silicon wafer 32 and substrate wafer 28 may be a substantially transparent substrate 34 such as glass or optical grade glass for example. Substrate wafer 28 may also consist of silicon or a polymer. Either silicon wafer 32 or substrate wafer 28 may be panel size, such as by way of example, for photovoltaic panels. For processing, semiconductor wafer 30 is generally bonded or laminated to a substrate wafer 28 using an adhesive 36 or double-sided tape for example. Other examples may include a chip release layer, a laser ablation layer, an adhesive and wafer, a chip release layer, a wafer release layer, or alternative attachment structures. These may be used singly, or in any combination. The bonding layer is very thin relative to the thickness of the wafers 30, 28.

Figure 6:
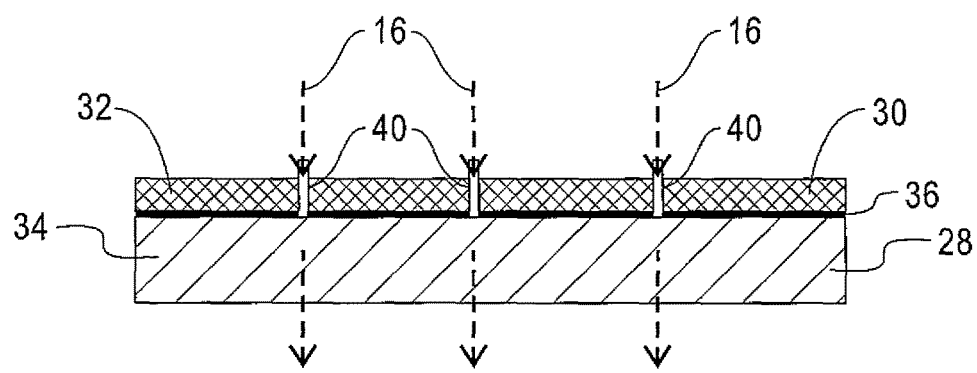
FIG. 6 is view similar to FIG. 5 depicting laser beams ablating one wafer and passing through a substrate wafer.

The semiconductor wafer 30 and substrate wafer 28, when laminated or bonded together, form a wafer stack 38. A wafer stack 38 may include multiple layers. A typical semiconductor wafer 10 has multiple circuits and is diced to separate the chips (not shown). Referring to FIG. 6, the laser beam(s) 16 may be optically divided for cutting multiple slots 40 at one time or produced by one or more lasers. The laser 14 is selected to emit a laser beam 16 having a set of parameters that define the characteristics of the emitted laser beam 16. The laser 14 may be adjustable allowing it to emit a laser beam 16 having a range of parameters. In a first embodiment the laser 14 is set to emit laser beam 16 having a set of parameters that avoid ablation of the substrate wafer 28 while it is also within or equal to an ablation threshold of the semiconductor wafer 30.

As shown in FIG. 6, when a first set of parameters define a laser beam 16 that is absorbed by the semiconductor wafer 30 material is ablated forming slots 40 therein. The laser beam 16 does not ablate the substrate wafer 28 if the laser beam 16 passes through without being absorbed. A set of parameters for defining laser beam 16 may include, but are not limited to, wavelength, pulse width and pulse frequency. By way of example, when semiconductor wafer 30 is a silicon wafer 32 and substrate wafer 28 is a glass wafer 42, the laser beam having a wavelength in the ultraviolet range will be strongly absorbed by the silicon, thereby ablating, or cutting it. More particularly, a laser beam 16 having a wavelength in the range of about 200 nm to 500 nm will be within the ablation threshold of silicon and avoid the ablation threshold of glass such that the glass is transparent to the laser beam 16 as shown in FIG. 6. The glass wafer 42 may be made from an optical grade glass.

For the case of selectively dicing a silicon wafer 32 paired with a glass wafer 42, the laser beam 16 having the following set of parameters is desirable: a wavelength in the range of about 200 nm to 500 nm, a pulse width within a range of about 50 femtoseconds to 10 nanoseconds and a pulse frequency within a range of about 500 to 100,000,000 pulses per second. The foregoing set of parameters define a laser beam 16 that will cause the ablation of slots 40 in the silicon wafer 32 while either not, or negligibly, degrading the glass wafer 42. This is advantageous in that the glass wafer 42 can be reused. Laser cutting may be used singly or in combination with other methods such as, by way of example, etching methods, deep reactive ion etching, reactive ion etch, chemical etch, saw sizing, or any other etching or cutting method. These methods are used to reduce defective flaws and thereby improve mechanical strength or to lower process cost or to create shaped and/or patterned cut edge.

Figure 7:
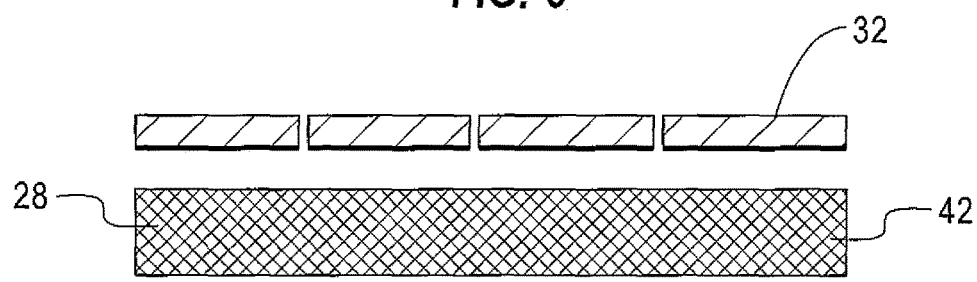
FIG. 7 is a view similar to FIG. 6 showing a diced wafer after release from a non-diced wafer or substrate.

As also shown in FIG. 7, the silicon wafer 32 is released from the substrate wafer 28 after dicing is complete.

Figure 8:
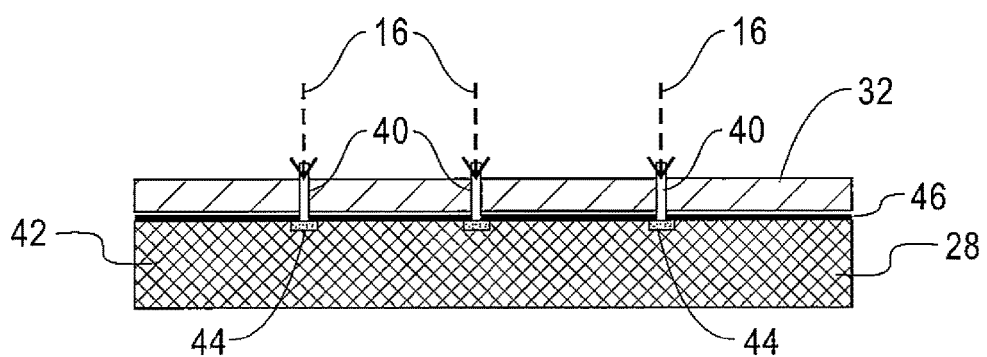
FIG. 8 is a view similar to FIG. 6 showing the position of a protective reflective material.

Referring also to FIG. 8, a reflective protection 44 may be placed at an interface 46 between semiconductor wafer and glass wafer 42. Reflective protection 44 may be patterned to better disperse the laser beam 16. This measure can aid in preventing the substrate wafer 28 from being damaged.

Figure 9:
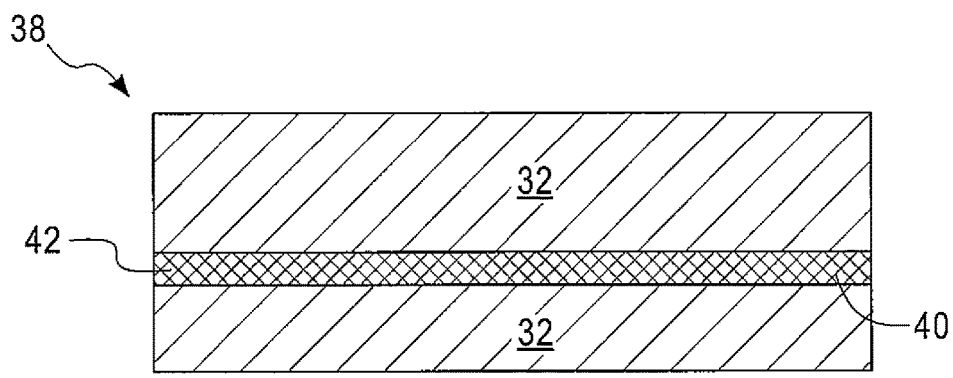
FIG. 9 is an enlarged partial top view showing a slot cut through a silicon wafer with an uncut glass wafer below.

Referring also to FIG. 9, an enlarged partial top view of a portion of the silicon wafer 32 on a glass wafer 42 is shown. One of the slots 40 is shown having been cut or ablated into the silicon wafer 32. Using the laser beam 16 as defined above, the slot 40 is 100 μm or less in width. As is conventionally known, slots 40 are cut along dicing streets laid out on the silicon wafer 32.

Figure 10:
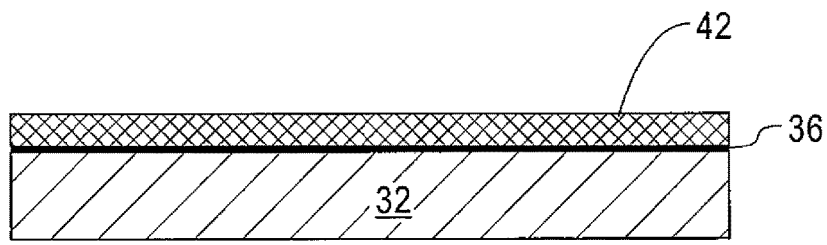
FIG. 10 is a view similar to FIG. 5 of a glass wafer bonded to a substrate of silicon.
Figure 11:
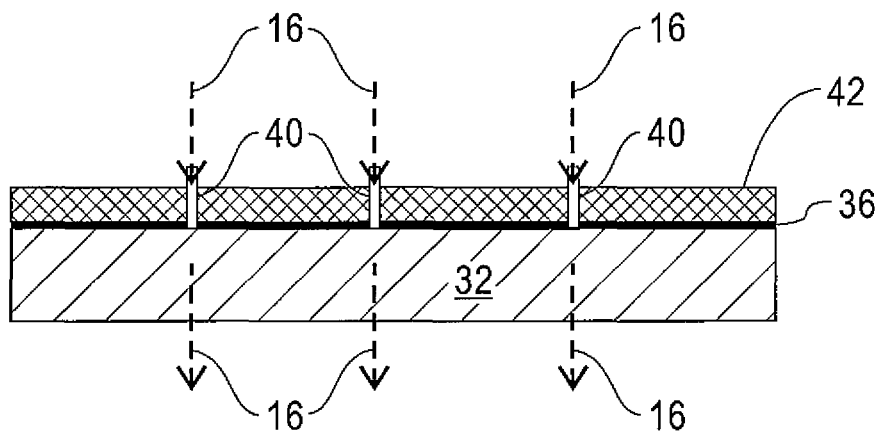
FIG. 11 is a view similar to FIG. 10 with a depiction of laser beams.
Figure 12:
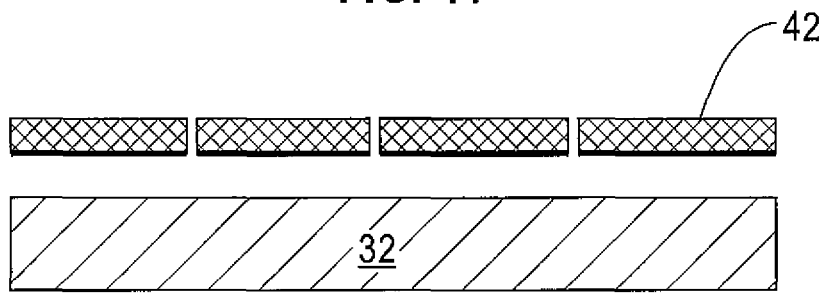
FIG. 12 is a view similar to FIG. 7 showing a diced glass wafer after release from the silicon substrate.
Figure 13:
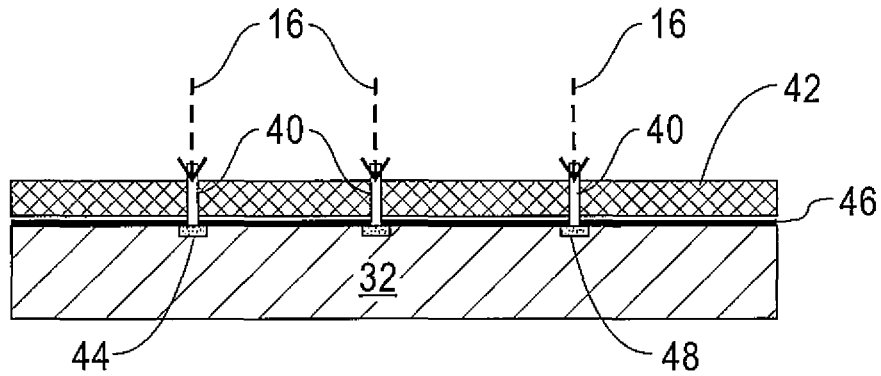
FIG. 13 is a view similar to FIG. 8 showing protective reflective material.

Referring also to FIGS. 10-13, another example embodiment is shown. It is sometimes desirable to selectively dice only the glass wafer 42 while protecting the silicon wafer 32 from damage. As shown in FIG. 10 the glass wafer 42 is bonded to the silicon wafer 32 by conventional means using an adhesive, a laser ablation layer, an adhesive and wafer, a chip release layer, a wafer release layer, or double sided tape 36. As shown in FIG. 11 the laser beam 16 is defined by a second set of parameters. The second set of parameters define a laser beam 16 that avoids ablation of the silicon wafer 32 and is within or equal to an ablation threshold of the glass wafer 42. Similar to above, FIG. 12 shows the glass wafer 42 after dicing and release from the silicon wafer 32. FIG. 13 shows a protective shield 48, that forms a reflective protection 44 at the interface 46 between the glass wafer 42 and the silicon wafer 32. In this embodiment, the second set of parameters defining the laser beam 16 include a wavelength within the infrared range. More specifically, the laser beam having a wavelength in the range of about 1,500 nm to 11,000 nm will be absorbed strongly by the glass wafer 42 and be transparent to the silicon wafer 32. The other parameters remain the same, those being a pulse width of about 50 femtoseconds to 10 nanoseconds and a pulse frequency of about 100 to 100,000,000 pulses per second.

An example method includes cutting a semiconductor wafer 30 on a substrate wafer 28 using a laser 14. By setting the laser 14 to a set of parameters defining a laser beam 16 that avoids ablation of the substrate wafer 28. The laser beam 16 may also be set equal to or within an ablation threshold of the semiconductor wafer 30 for selectively ablating the semiconductor wafer 30. The set of parameters includes wavelength, pulse width and pulse frequency.

The foregoing set of parameters defining a laser beam 16 represents a first set of parameters, and the method also includes setting the laser 14 to a second set of parameters, wherein the second set of parameters define a laser beam 16 that avoids ablation of the semiconductor wafer 30 while the laser beam 16 is set within or equal to an ablation threshold of the substrate wafer 28 for cutting the substrate wafer 28. The second set of parameters includes at least one wavelength set within an ultraviolet range.

The set of parameters may include at least one pulse width set within a range of pulse widths between about 50 femtoseconds and 10 nanoseconds. The set of parameters may include at least one pulse frequency set within a range of pulse frequency from about 500 to 100,000,000 pulses per second.

The method may include bonding the semiconductor wafer 30 to the substrate wafer 28 using either an adhesive or double sided tape 36. A wafer or chip release layer may also be used, as well as alternative attachment structures. The method may include focusing the laser beam 16 at an interface 46 between the semiconductor wafer 30 and the substrate wafer 28. The method may include providing a reflective protection located between the semiconductor wafer 30 and the substrate wafer 28. The method may include providing the substrate wafer 28 as an optical grade glass wafer 42. Other examples of material include silicon, glass, polymers and can be in layers of one or more of each type in different combinations. In one embodiment the laser beam 16 may have at least one wavelength in an infrared range.

Another example method of dicing wafers 18 includes selectively dicing a silicon wafer 32 bonded to a substantially transparent substrate 34 by a laser 14. By setting the laser 14 to have a laser beam 16 with at least one wavelength in a range of about 200 nm to 500 nm and setting the laser 14 such that the laser beam 16 has at least one pulse width within a range of pulse widths between about 50 femtoseconds and 10 nanoseconds and setting the laser 14 such that the laser beam 16 has at least one pulse frequency within a range of pulse frequency from about 100 to 100,000,000 pulses per second, such that the laser beam 16 is equal to or below an ablation threshold of the substantially transparent substrate 34 and the laser beam 16 is equal to or above an ablation threshold of the silicon wafer 32 for dicing the silicon wafer 32 while the substantially transparent substrate 34 supports the silicon wafer 32. The laser cutting may also be combined with other methods of cutting or etching. By way of example these methods may include, but are not limited to; deep reactive ion etching, reactive ion etch, chemical etch, saw sizing or other methods. Combined methods may reduce defective flaws and thereby improve mechanical strength or to lower process costs or to create shaped and/or patterned cut edge.

The method may include reflective protection 44 being placed between the silicon wafer 32 and the substantially transparent substrate 34 to further protect the substantially transparent substrate 34 from the laser beam 16. The method may also include resetting the laser 14 such that the laser beam 16 has at least one wavelength in the range of about 1,500 nm to 11,000 nm which should be at least nominally above, or equal to, the ablation threshold of the substantially transparent substrate 34 and below, or equal to, the ablation threshold of the silicon wafer 32.

The method may include placing a reflective protection 44 between the substantially transparent substrate and the silicon wafer 32 thereby further protecting the silicon wafer 32 from the laser beam 16. The substantially transparent substrate 34 may be provided as glass.

An example apparatus for dicing a semiconductor wafer 30 on a glass wafer 42 may be provided comprising a laser 14 adapted to emit a laser beam 16, the laser beam 16 having parameters selected to avoid ablation of the glass wafer 42. The parameters are selected to cause ablation for dicing the semiconductor wafer 30 such that the glass wafer 42 is re-useable after dicing of the semiconductor wafer 30 is completed. The laser beam 16 parameters include wavelength, pulse width and pulse frequency.

A reflective protection 44 may be provided between the semiconductor wafer 30 and the glass wafer 42 to protect the glass wafer 42. The laser beam 16 may include at least one wavelength in an ultraviolet range of about 200 nm to 500 nm. The laser beam 16 parameters can alternatively be selected to cause ablation of the glass wafer 42 and selected to avoid ablation of the semiconductor wafer 30 such that the glass wafer 42 is diced with insignificant damage to the semiconductor wafer 30. In this embodiment the laser beam 16 may have at least one wavelength in the infrared range.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. A method comprising:
   setting a laser to a set of parameters defining a laser beam;
   cutting a slot in a semiconductor wafer on a substrate wafer by said laser;
   disposing a reflective protection at an interface of said semiconductor wafer and said substrate wafer under said slot at a point at which said slot is cut, said reflective protection comprising a discrete patterned reflective protection; and
   reflecting said laser beam from said patterned reflective protection on said substrate wafer to disperse said laser beam, said laser beam avoiding ablation of said substrate wafer,
   wherein said laser beam is set equal to or within an ablation threshold of said semiconductor wafer for selectively ablating said semiconductor wafer; and
   wherein said set of parameters includes wavelength, pulse width and pulse period.

2. The method of claim 1, wherein said set of parameters defining a laser beam represents a first set of parameters, and the method further comprises:
   setting said laser to a second set of parameters, wherein said second set of parameters define said laser beam that avoids ablation of said semiconductor wafer; and
   wherein said laser beam is set within or equal to an ablation threshold of said substrate wafer for cutting said substrate wafer.

3. The method of claim 2, wherein said laser beam has at least one wavelength in an infrared range.

4. The method of claim 1, wherein said set of parameters includes at least one wavelength set within an ultraviolet range.

5. The method of claim 1, wherein said set of parameters includes at least one pulse width set within a range of pulse widths between about 50 and 150 femtoseconds.

6. The method of claim 1, wherein said set of parameters includes at least one pulse period set within a range of pulse periods from about 500 to 1,500 pulses per second.

7. The method of claim 1, wherein said semiconductor wafer is bonded to said substrate wafer using either an adhesive or double sided tape.

8. The method of claim 1, wherein said laser beam is focused at said interface between said semiconductor wafer and said substrate wafer.

9. The method of claim 1, wherein said substrate wafer is an optical grade glass wafer.

10. The method of claim 1, wherein the semiconductor and/or substrate are in the form of a panel.

11. The method of claim 10, wherein the semiconductor wafer and/or substrate wafer are at least one of; silicon, glass, or polymer, and can include one or more layers.

12. The method of claim 1, wherein the semiconductor wafer and/or substrate wafer consists of at least one of; silicon, glass, polymer and includes one or more layers or stacked layers.

13. The method of claim 1, wherein the semiconductor wafer and/or substrate wafer are at least one of; silicon, glass, or polymer, and can include one or more layers.

14. The method in claim 1, wherein cutting may be by laser or in combination with cutting or etching methods such as deep reactive ion etching (DRIE), reactive ion etch (RIE), chemical etch, saw sizing or alternate cutting or etching method in order to reduce defective flaws and thereby improve mechanical strength and/or to lower process cost and/or to create shaped and/or patterned cut edge.

15. A method of dicing wafers comprising:
setting a laser to have a laser beam with at least one wavelength in a range of about 200 nm to 500 nm;
setting said laser such that said laser beam has at least one pulse width within a range of pulse widths between about 50 and 150 femtoseconds; and
setting said laser such that said laser beam has at least one pulse period within a range of pulse periods from about 100 to 1,500 pulses per second, such that said laser beam is equal to or below an ablation threshold of a substantially transparent substrate and said laser beam is equal to or above an ablation threshold of a silicon wafer, said silicon wafer being bonded to said substantially transparent substrate, said laser beam being for ablating said silicon wafer while said substantially transparent substrate supports said silicon wafer;
disposing at least one patterned reflective protector at an interface of said substantially transparent substrate and said silicon wafer at a point at which said substantially transparent substrate is ablated, said at least one patterned reflective protector comprising a discrete patterned reflective protector; and
selectively dicing said silicon wafer bonded to said substantially transparent substrate by said laser by focusing said laser beam to ablate said silicon wafer and subsequently reflecting said laser beam from said patterned reflective protector on said substantially transparent substrate to disperse said laser beam.

16. The method of claim 15, wherein said patterned reflective protector is placed between said silicon wafer and said substantially transparent substrate to protect said substantially transparent substrate.

17. The method of claim 15, wherein said laser is reset such that said laser beam has wavelength(s) in the range of about 1,500 nm to 11,000 nm which is at least nominally above, or equal to, the ablation threshold of said substantially transparent substrate and below, or equal to, the ablation threshold of the silicon wafer.

18. The method of claim 17, wherein said patterned reflective protector is placed between the substantially transparent substrate and the silicon wafer thereby protecting the silicon wafer from the laser beam.

19. The method of claim 15 wherein said substantially transparent substrate is provided as glass.

20. An apparatus for cutting a semiconductor wafer on a glass wafer, said apparatus comprising:
a laser, the laser being set to a set of parameters and adapted to emit a laser beam and to cut a slot in said semiconductor wafer on said glass wafer using the laser, and
at least one discrete patterned reflective protection disposed on an interface between said semiconductor wafer and said glass wafer under said slot at which said laser beam cuts said semiconductor wafer,
wherein said parameters of said laser are selected to avoid ablation of said glass wafer;
wherein said parameters are selected to cause cutting of said semiconductor wafer such that said glass wafer is re-useable after cutting of said semiconductor wafer is completed;
wherein said parameters of said laser beam include wavelength, pulse width and pulse period; and
wherein said laser is configured to reflect off said at least one discrete patterned reflective protection between said semiconductor wafer and said glass wafer to disperse said laser beam to avoid said ablation of said glass wafer.

21. The apparatus of claim 20, wherein said wavelength is in an ultraviolet range of about 200 nm to 500 nm.

22. The apparatus of claim 20, wherein said laser beam parameters are selected to cause cutting of the semiconductor wafer and selected to avoid cutting of the glass wafer such that the semiconductor wafer is cut with insignificant damage to the glass wafer.

23. The apparatus of claim 22, wherein said wavelength is in the infrared range.

* * * * *